United States Patent
Cho et al.

(10) Patent No.: US 7,460,386 B2
(45) Date of Patent: *Dec. 2, 2008

(54) LAYOUT METHOD OF A SEMICONDUCTOR MEMORY DEVICE

(75) Inventors: Beak-hyung Cho, Hwaseong-si (KR); Du-eung Kim, Yongin-si (KR); Byung-gil Choi, Yongin-si (KR); Choong-keun Kwak, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/790,444

(22) Filed: Apr. 25, 2007

(65) Prior Publication Data

US 2007/0195591 A1  Aug. 23, 2007

Related U.S. Application Data

(63) Continuation of application No. 11/315,130, filed on Dec. 23, 2005, now Pat. No. 7,227,776.

(30) Foreign Application Priority Data

Jun. 21, 2005  (KR) .................... 10-2005-0053550

(51) Int. Cl.
*G11C 5/02* (2006.01)
*G11C 5/06* (2006.01)
*G11C 11/00* (2006.01)

(52) U.S. Cl. ..................... 365/51; 365/63; 365/148; 365/163

(58) Field of Classification Search .................... 365/51
See application file for complete search history.

(56) References Cited

U.S. PATENT DOCUMENTS

| 6,735,104 | B2 | 5/2004 | Scheuerlein |
| 6,778,421 | B2 | 8/2004 | Tran |
| 6,937,505 | B2 * | 8/2005 | Morikawa .................... 365/158 |
| 6,982,902 | B2 * | 1/2006 | Gogl et al. .................... 365/158 |
| 7,002,837 | B2 * | 2/2006 | Morimoto .................... 365/148 |
| 7,027,342 | B2 | 4/2006 | Inoue |
| 7,123,535 | B2 * | 10/2006 | Kurotsuchi et al. ...... 365/225.7 |
| 7,227,776 | B2 * | 6/2007 | Cho et al. .................... 365/163 |

(Continued)

FOREIGN PATENT DOCUMENTS

JP  2004-110867  4/2004

*Primary Examiner*—Son L Mai
(74) *Attorney, Agent, or Firm*—Volentine & Whitt, PLLC

(57) ABSTRACT

The layout method for a semiconductor device includes locating a plurality of first bit line selection circuits at a first side of a variable resistive memory cell block, and locating a plurality of second bit line selection circuits at a second side of the variable resistive memory cell block opposite the first side. The method further includes connecting the first bit line selection circuits with respective odd-numbered local bit lines of the variable resistive memory cell block, and connecting the second bit line selection circuits with respective even-numbered local bit lines of the variable resistive memory cell block. The method still further includes selectively connecting respective odd-numbered local bit lines to a global bit line using the first bit line selection circuits, and selectively connecting respective even-numbered local bit lines to the global bit line using the second bit line selection circuits.

14 Claims, 5 Drawing Sheets

U.S. PATENT DOCUMENTS

2006/0120148 A1  6/2006  Kim et al.
2006/0148135 A1* 7/2006  Matsuoka et al. ........... 438/127
2006/0291277 A1  12/2006 Cho et al.
2007/0210296 A1* 9/2007  Cote et al. .................... 257/2

* cited by examiner

LAYOUT METHOD OF A SEMICONDUCTOR MEMORY DEVICE

CROSS-REFERENCE TO RELATED APPLICATION(S)

This is a continuation of, and a claim of priority is made to, U.S. non-provisional patent application Ser. No. 11/315,130, filed Dec. 23, 2005, now U.S. Pat. No. 7,227,776, the disclosure of which is incorporated herein in its entirety by reference.

BACKGROUND OF THE INVENTION

1. Field of the Invention

The present invention relates to semiconductor memory devices, and more particularly, the present invention relates to a layout method of a semiconductor memory device.

A claim of priority is made to Korean Patent Application No. 10-2005-0053550, filed on Jun. 21, 2005, in the Korean Intellectual Property Office, the disclosure of which is incorporated herein in its entirety by reference.

2. Description of the Related Art

A phase-change random access memory (PRAM), also known as an Ovonic Unified Memory (OUM), includes a phase-change material such as a chalcogenide alloy which is responsive to heat so as to be stably transformed between crystalline and amorphous states. Such a PRAM is disclosed, for example, in U.S. Pat. Nos. 6,487,113 and 6,480,438.

The phase-change material of the PRAM exhibits a relatively low resistance in its crystalline state, and a relatively high resistance in its amorphous state. In conventional nomenclature, the low-resistance crystalline state is referred to a 'set' state and is designated logic "0", while the high-resistance amorphous state is referred to as a 'reset' state and is designated logic "1".

The terms "crystalline" and "amorphous" are relative terms in the context of phase-change materials. That is, when a phase-change memory cell is said to be in its crystalline state, one skilled in the art will understand that the phase-change material of the cell has a more well-ordered crystalline structure when compared to its amorphous state. A phase-change memory cell in its crystalline state need not be fully crystalline, and a phase-change memory cell in its amorphous state need not be fully amorphous.

Generally, the phase-change material of a PRAM is reset to an amorphous state by heating the material in excess of its melting point temperature for a relatively short period of time. On the other hand, the phase-change material is set to a crystalline state by heating the material below its melting point temperature for a longer period of time.

The speed and stability of the phase-change characteristics of the phase-change material are critical to the performance characteristics of the PRAM. As suggested above, chalcogenide alloys have been found to have suitable phase-change characteristics, and in particular, a compound including germanium (Ge), antimony (Sb) and tellurium (Te) (e.g., $Ge_2Sb_2Te_5$ or GST) exhibits a stable and high speed transformation between amorphous and crystalline states.

FIGS. 1A and 1B illustrate a memory cell 10 in a 'set' state and in a 'reset' state, respectively, and FIG. 2 is an equivalent circuit diagram of the memory cell 10 of FIGS. 1A and 1B. As shown, the memory cell 10 includes a phase-change element 11 and an access transistor 20 connected in series between a bit line BL and a reference potential (e.g., ground). Also, as shown, a gate of the access transistor 20 is connected to a word line.

It should be noted that the structure of the phase-change element 11 is presented as an example only, and that other structures may be possible. Similarly, the connections illustrated in FIGS. 1A, 1B and 2 are presented as examples only, and other configurations are possible. For example, the memory cell 10 may include the phase-change element 11 and a diode (not shown) connected in series between the bit line BL and the word line WL.

In each of FIGS. 1A and 1B, the phase-change element 11 includes a top electrode 12 formed on a phase-change material 14. In this example, the top electrode 12 is electrically connected to a bit line BL of a PRAM memory array (not shown). A conductive bottom electrode contact (BEC) 16 is formed between the phase-change material 14 and a conductive bottom electrode 18. The access transistor 20 is electrically connected between the bottom electrode 18 and the reference potential, and the gate of the access transistor 20 is electrically connected to a word line WL of the PRAM cell array (not shown).

In FIG. 1A, the phase-change material 14 is illustrated as being in its crystalline state. As mentioned previously, this means that the memory cell 10 is in a low-resistance 'set' state or logic 0 state. In FIG. 1B, a portion of the phase-change material 14 is illustrated as being amorphous. Again, this means that the memory cell 10 is in a high-resistance 'reset' state or logic 1 state.

The set and reset states of the memory cell 10 of FIGS. 1A and 1B are establish by controlling the magnitude and duration of current flow through the BEC 16. That is, as shown in FIG. 2, the memory cell 10 is activated (or accessed) by applying a LOW level voltage to the word line WL. When activated, the phase-change element 11 is programmed according to the voltage of the bit line BL. More specifically, the bit line BL voltage is controlled to establish a programming current which causes the BEC 16 to act as a resistive heater which selectively programs the phase-change material 14 in its 'set' and 'reset' states.

FIG. 3 is a view showing the core structure layout of a conventional phase change memory device 300.

Referring to FIG. 3, the phase change memory 300 includes a plurality of memory cell blocks CBLK, a plurality of word line driving blocks WDU, a plurality of bit line selection blocks YPASS, and a plurality of discharge blocks YDCU. Each of the word line driving blocks WDU includes word line driving circuits (not shown) for driving word lines (not shown) of the memory cell blocks CBLK. Each of the bit line selection blocks YPASS includes bit line selection circuits YSEL<1-n> which are responsive to selection signals Y<1-n> to select respective bit lines BL<1-n> of the memory cell blocks CBLK. Likewise, each of the discharge blocks YDCU includes discharge circuits BLD<1-n> which are responsive to inverted selection signals Y<1-n>b to discharge the respective bit lines BL<1-n>.

FIG. 3 also illustrates block areas which may contain, for example, a column decoder YDEC, a sense amplification circuit SA, and a write driver WD.

As shown in FIG. 3, the bit line selection circuits YSEL<1-n> and the discharge circuits BLD<1-n> are implemented by MOS transistors. The MOS transistors of the bit line selection circuits YSEL<1-n> are inserted in the respective bit lines BL<1-n>, while the MOS transistors of the discharge circuits BLD<1-n> are connected between the respective bit lines BL<1-n> and a reference potential VSS e.g., ground. As such, a pair of MOS transistors(a bit line selection transistor and a discharge transistor) is connected to each of the bit line BL<1-n> adjacent the memory block CBLK containing the bit lines BL<1-n>. It is difficult (and sometimes impossible) from a layout perspective to place these pair of MOS transistors at the end of each bit line BL, particularly as the bit lines BL<1-n> are brought closer together to increase memory density.

SUMMARY OF THE INVENTION

According to an aspect of the present invention, a layout method of a semiconductor memory device is provided. The layout method includes locating a plurality of first bit line selection circuits at a first side of a variable resistive memory cell block, and locating a plurality of second bit line selection circuits at a second side of the variable resistive memory cell block opposite the first side. The method further includes connecting the first bit line selection circuits with respective odd-numbered local bit lines of the variable resistive memory cell block, and connecting the second bit line selection circuits with respective even-numbered local bit lines of the variable resistive memory cell block. The method still further includes selectively connecting respective odd-numbered local bit lines to a global bit line using the first bit line selection circuits, and selectively connecting respective even-numbered local bit lines to the global bit line using the second bit line selection circuits.

According to another aspect of the present invention, a layout method of a semiconductor memory device is provided. The layout method includes locating a first bit line selection circuit at a first side of a variable resistive memory cell block, and locating a second bit line selection circuit at a second side of the variable resistive memory cell block opposite the first side, and locating a first discharge circuit at a first side of the variable resistive memory cell block, and locating a second discharge circuit at a second side of the variable resistive memory cell block opposite the first side. The first bit line selection circuit selectively connects one of the local bit lines to a global bit line, and the second bit line selection circuit selectively connects another of local bit lines to the global bit line. The first discharge circuit selectively discharges said one of the local bit lines, and the second discharge circuit selectively discharges said other of the local bit lines.

According to still another aspect of the present invention, a layout method of a semiconductor memory device is provided. The layout method includes selectively connecting a first set of local bit lines, respectively, to a global bit line adjacent a first side of a variable resistive memory cell block, and selectively connecting a second set of local bit lines, respectively, to the global bit line adjacent a second side of the variable resistive memory cell block, where the first side is opposite the second side.

BRIEF DESCRIPTION OF THE DRAWINGS

The above and other features and advantages of the present invention will become readily apparent from the detailed description that follows, with reference to the accompanying drawings, in which.

DETAILED DESCRIPTION OF PREFERRED EMBODIMENTS

Figure 1A:
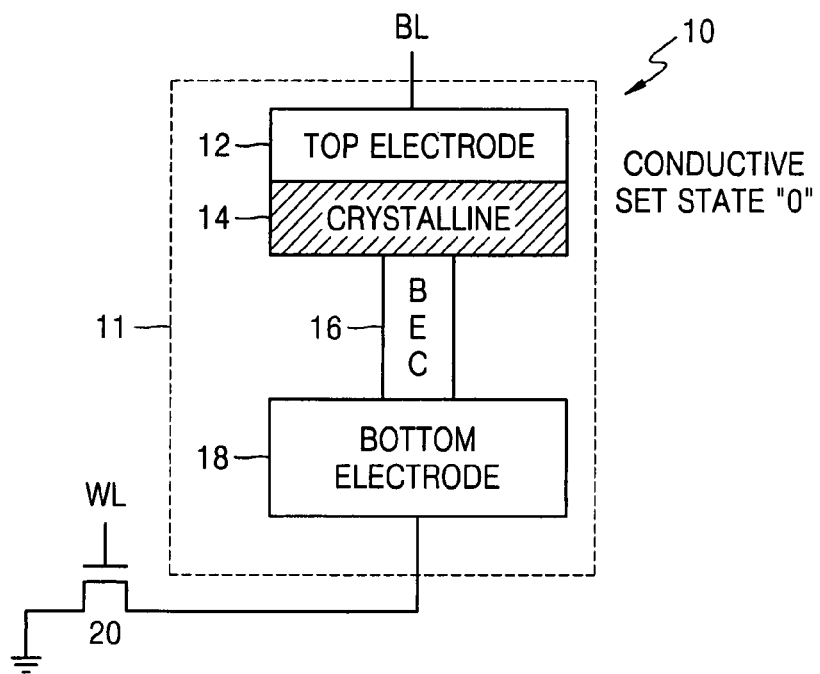
FIGS. 1A and 1B are schematic views of a phase change memory cell r in a crystalline state and an amorphous state, respectively.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements, and thus their descriptions will not be repeated.

Figure 4:
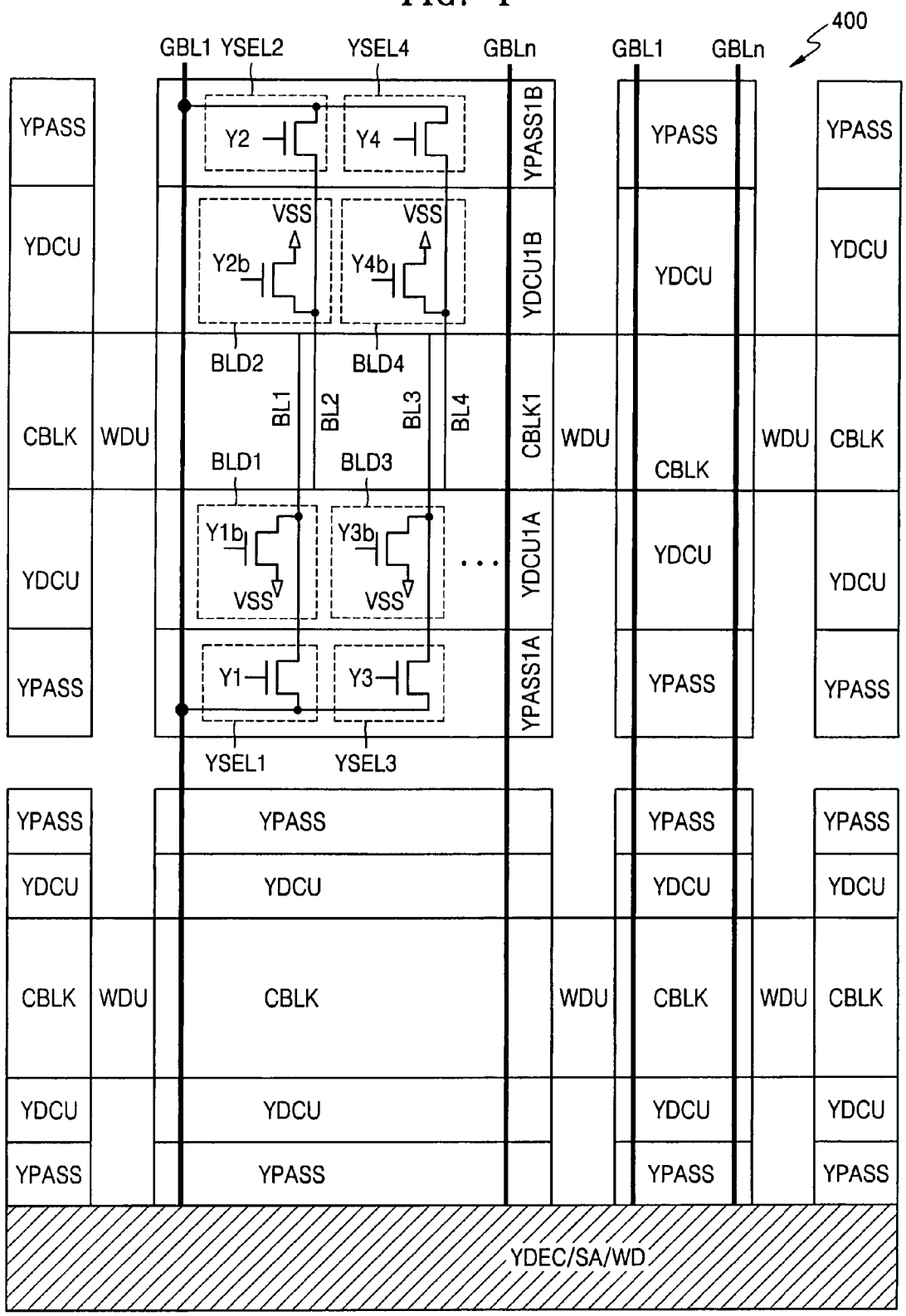
FIG. 4 is a view showing the core structure layout of a phase change memory device according to an embodiment of the present invention.

FIG. 4 is a view showing the core structure layout of a phase change memory device 400 according to an embodiment of the present invention.

Referring to FIG. 4, the phase change memory device 400 of this embodiment includes a plurality of memory cell blocks CBLK, a plurality of word line driving blocks WDU, a plurality of bit line selection blocks YPASS, and a plurality of discharge blocks YDCU. Also illustrated in FIG. 4 are block areas which may contain, for example, a column decoder YDEC, a sense amplification circuit SA, and a write driver WD.

Figure 1B:
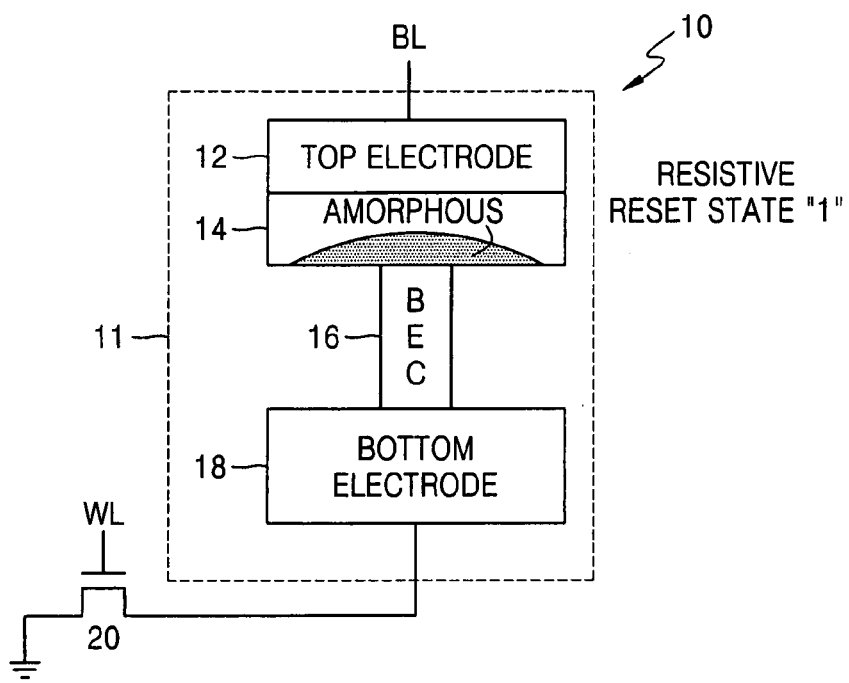
Figure 2:
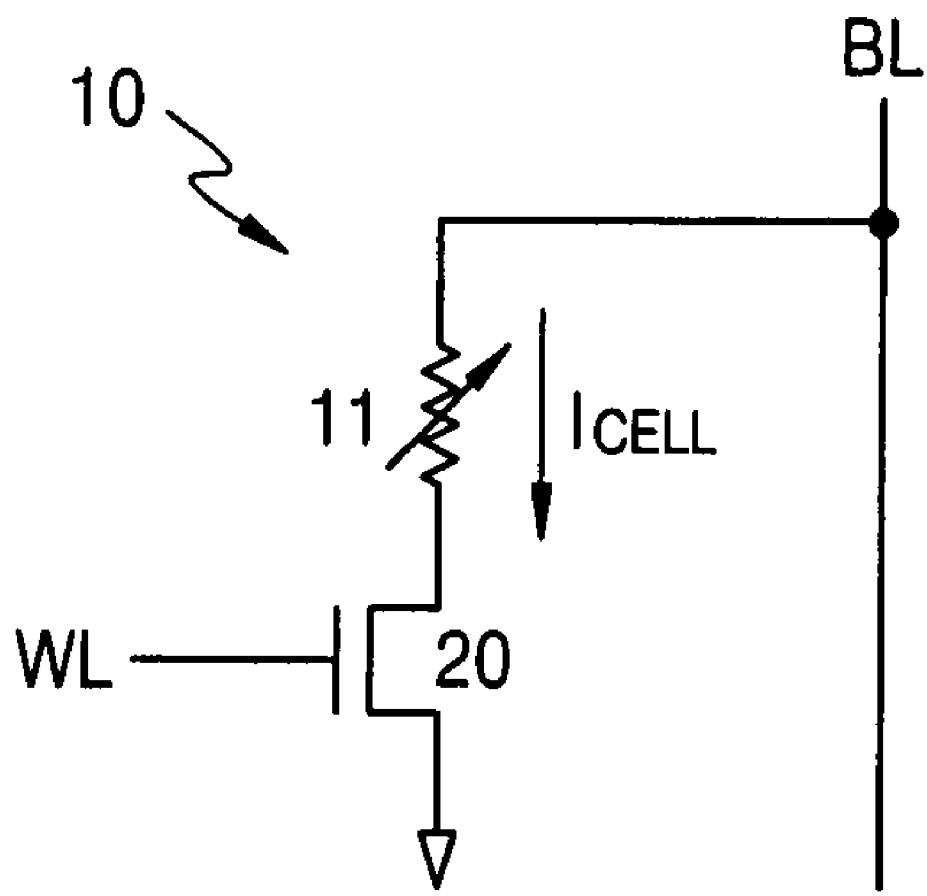
FIG. 2 is an equivalent circuit diagram of the phase change memory cell shown in FIGS. 1A and 1B.
Figure 3:
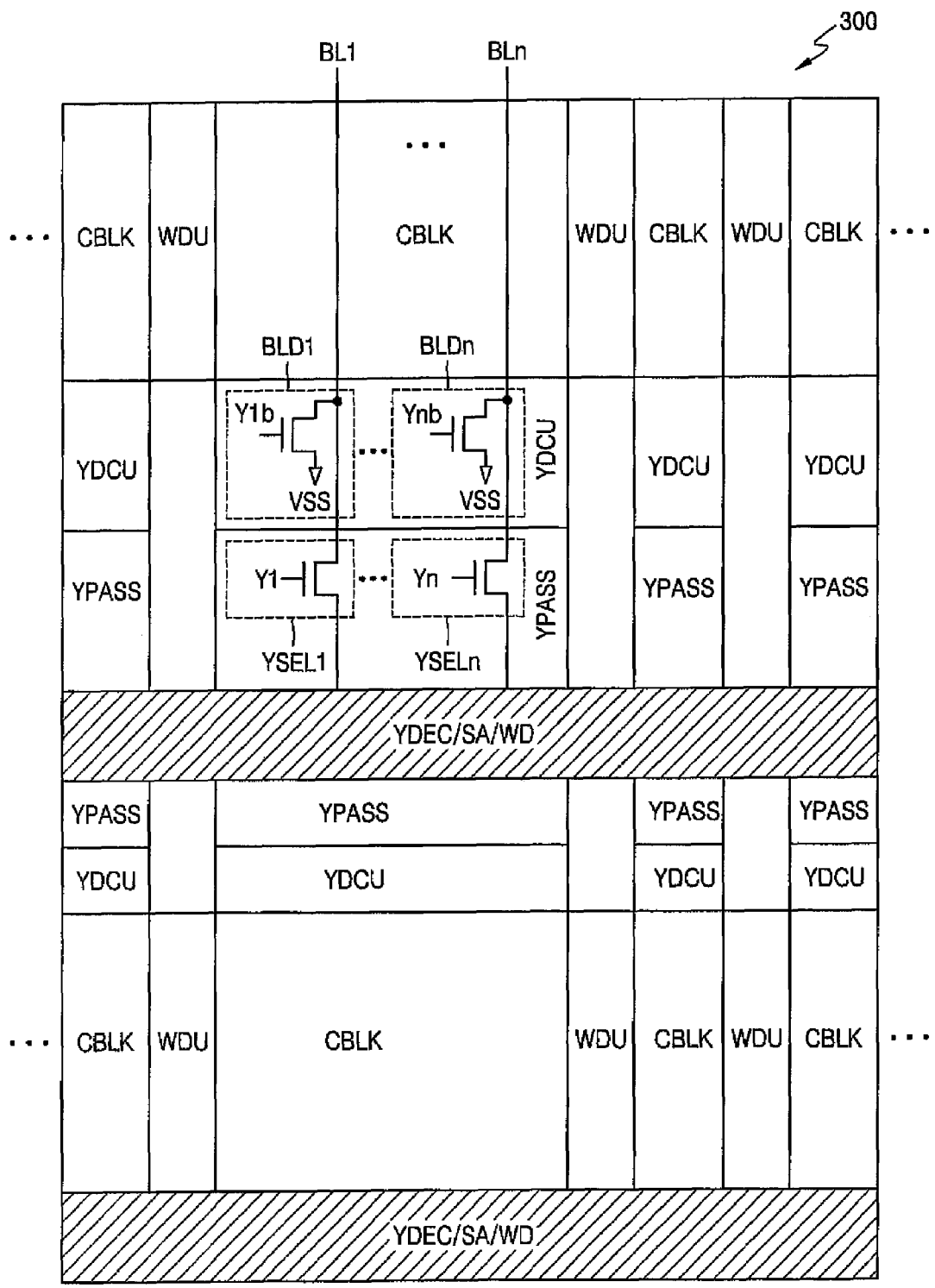
FIG. 3 is a view showing the core structure layout of a conventional phase change memory device.

Each of the memory cell blocks CBLK includes the phase change memory cells such as those depicted, for example, in previously discussed FIGS. 1A, 1B and 2. A phase change material of the cells may, for example, be composed of germanium (Ge), antimony (Sb), and tellurium (Te).

The word line driving blocks WDU each contains a plurality of word line drivers (not shown) which function in a well known manner to drive respective word lines (not shown) of an adjacent memory cell block CBLK. It should be noted that the word line driving blocks WDU can be placed at locations other than those illustrated in FIG. 4, and accordingly, the present embodiment is not limited in this respect. Likewise, locations of the column decoder YDEC, a sense amplification circuit SA, and a write driver WD, are not limited to those shown in FIG. 4.

For convenience of explanation and to simplify the description, this embodiment of the invention is described in further detail with respect to the first four (4) bit lines BL1<1-4> of the memory cell block CBLK1 of FIG. 4. The other memory blocks CBLK may be similarly configured.

The bit line selection block YPASS adjacent the memory cell block CBLK1 is divided into sub-blocks YPASS1A and YPASS1B which are located opposite sides of the memory cell block CBLK1. The bit lines BL of the memory cell block CBLK1 are likewise divided into two sets of bit lines BL. In example of this embodiment, the two sets of bit lines BL are the odd-numbered bit lines BL1 and BL3, and the even-numbered bit lines BL2 and BL4. Also, in the example of this embodiment, the sub-block YPASS1A is connected to odd numbered bit lines BL1 and BL3, and the sub-block YPASS1B is connected to even numbered bit lines BL2 and BL4.

The sub-block YPASS1A includes plurality of bit line selection circuits YSEL1 and YSEL3, while the sub-block YPASS1B includes a plurality of bit line selection circuits YSEL2 and YSEL4. The bit line selection circuits YSEL1 and YSEL3 are responsive to selection signals Y1 and Y3 to connect the respective bit lines BL1 and BL3 to a global bit line GBL1 at one side of the memory cell block CBLK1. The bit line selection circuits YSEL2 and YSEL4 are responsive to selection signals Y2 and Y4 to connect the respective bit lines BL2 and BL4 to the global bit line GBL1 at the other side of the memory cell block CBLK1.

Also, the discharge block YDCU adjacent the memory cell block CBLK1 is divided into sub-blocks YDCU1A and YDCU1B which are located opposite sides of the memory cell block CBLK1. In the example of this embodiment, the sub-block YDCU1A is connected to odd numbered bit lines BL1 and BL3, and the sub-block YDCU1B is connected to even numbered bit lines BL2 and BL4.

The sub-block YDCU1A includes a plurality of discharge circuits BLD1 and BLD3, while the sub-block YDCU1B includes a plurality of discharge circuits BLD2 and BLD4. The discharge circuits BLD1 and BLD3 are responsive to discharge control signals Y1b and Y3b to connect the respective bit lines BL1 and BL3 to a reference potential VSS (e.g., ground) at one side of the memory cell block CBLK1. The discharge circuits BLD2 and BLD4 are responsive to discharge control signals Y2b and Y4b to connect the respective bit line BL2 and BL4 to a reference potential VSS (e.g., ground) at the other side of the memory cell block CBLK1.

In the example of this embodiment, the bit line selection circuits YSEL<1-4> and the discharge circuits BLD<1-4> are implemented by NMOS transistors as shown in FIG. 4. In this case, the selection signals Y<1-4> may be inverted relative to the discharge control signals Y<1-4>b. Thus, for example, when the selection signal Y1 is HIGH, the discharge control signal Y1b is LOW. In this state, the bit line BL1 is connected to the global bit line GBL1, and the discharge circuit BLD1 is OFF. In contrast, when the selection signal Y1 is LOW, the discharge control signal Y1b is HIGH. In this state, the bit line BL1 is isolated from the global bit line GBL1, and the bit line BL1 is discharged to VSS by the discharge circuit BLD1. It should be noted, however, that the invention is not limited to these particular examples, and that other configurations of the possible.

As described above, the bit line selection block YPASS is divided into sub-blocks YPASS1A and YPASS1B located at opposite sides of the memory cell block CBLK1. Since the circuitry associated with the bit line selection block YPASS is divided in this manner, it becomes possible to decrease the pitch between the bit lines BL<1-4>. Likewise, according to the present embodiment, the discharge block YDCU is divided into sub-blocks YDCU1A and YDCU1B located at opposite sides of the memory cell block CBLK1. Again, by dividing the discharge block YDCU in this manner, it is possible to decrease the pitch between the bit lines BL<1-4>. Thus, according to the present embodiment, a more densely integrated memory device can be fabricated.

It is further noted that, according to the present embodiment, the current flow of each adjacent pair of bit lines BL<1-4> is in opposite directions.

Figure 5:
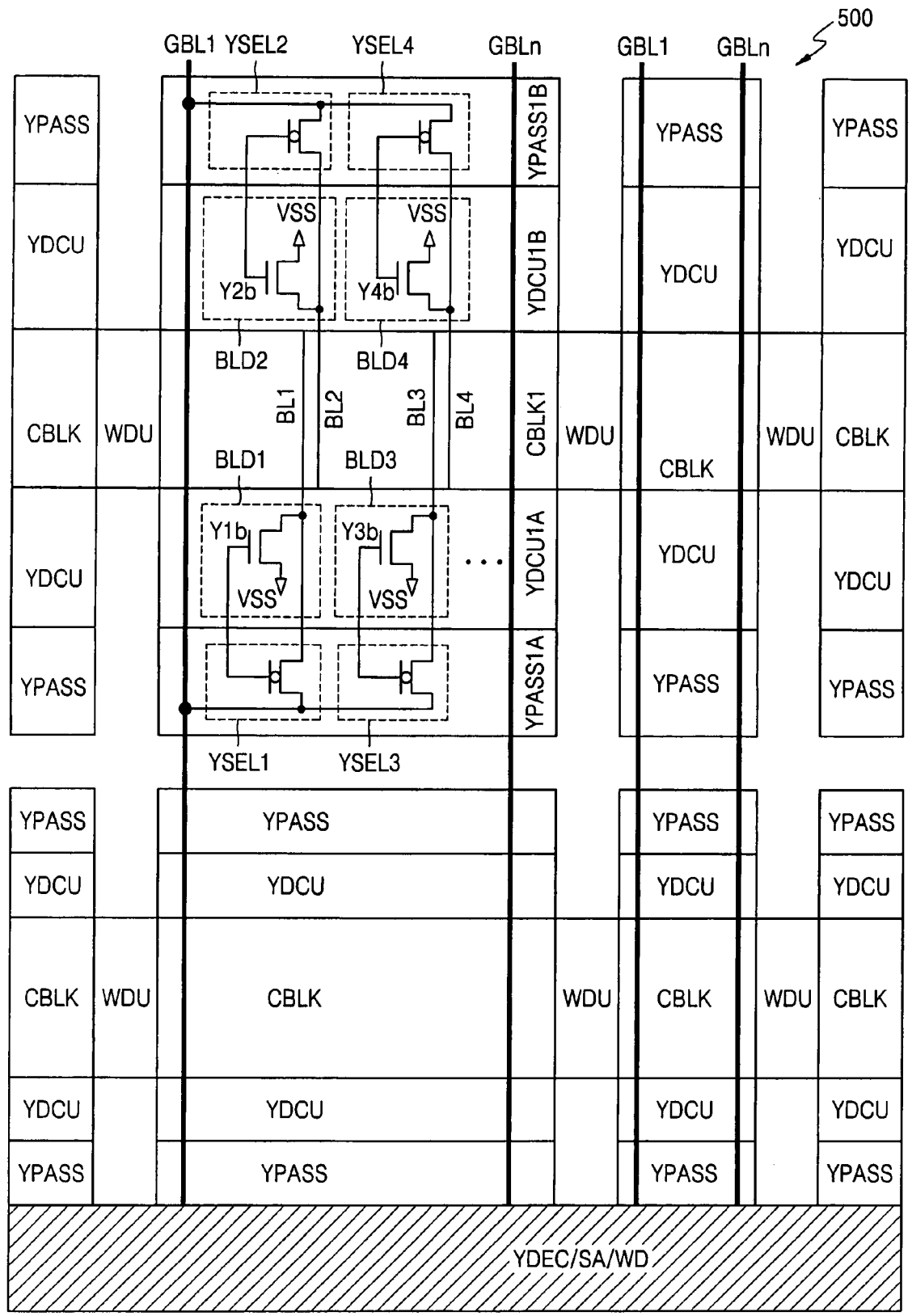
FIG. 5 is a view showing the core structure layout of a phase change memory device according to another embodiment of the present invention.

FIG. 5 is a view showing a core structure layout of a phase change memory device 500 according to another embodiment of the present invention.

The general layout of the cell blocks CBLK, the word line driving blocks WDU, the bit line selection blocks YPASS, the discharge blocks YDCU, the column decoder YDEC, the sense amplification circuit SA, and the write driver WD of the embodiment of FIG. 5 is similar to that of previously discussed FIG. 4, and accordingly, a detailed description thereof is omitted here to avoid redundancy.

Referring to FIG. 5, the phase change memory device 500 has the same configuration as the phase change memory device 400 shown in FIG. 4, except that the structures of bit line selection circuits YSEL1 through YSEL4 are different. Therefore, the structure of each of the bit line selection circuits YSEL1 through YSEL4 shown in FIG. 5 will be described below.

Also, like the embodiment of FIG. 4, the bit line selection block YPASS of FIG. 5 adjacent the memory cell block CBLK1 is divided into sub-blocks YPASS1A and YPASS1B which are located opposite sides of the memory cell block CBLK1. In the example of this embodiment, the sub-block YPASS1A is connected to odd numbered bit lines BL1 and BL3, and the sub-block YPASS1B is connected to even numbered bit lines BL2 and BL4.

The sub-block YPASS1A includes plurality of bit line selection circuits YSEL1 and YSEL3, while the sub-block YPASS1B includes a plurality of bit line selection circuits YSEL2 and YSEL4. The bit line selection circuits YSEL1 and YSEL3 are responsive to control signals Y1b and Y3b to connect the respective bit lines BL1 and BL3 to a global bit line GBL1 at one side of the memory cell block CBLK1. The bit line selection circuits YSEL2 and YSEL4 are responsive to selection signals Y2b and Y4b to connect the respective bit lines BL2 and BL4 to the global bit line GBL1 at the other side of the memory cell block CBLK1.

Also, the discharge block YDCU adjacent the memory cell block CBLK1 is divided into sub-blocks YDCU1A and YDCU1B which are located opposite sides of the memory cell block CBLK1. In the example of this embodiment, the sub-block YDCU1A is connected to odd numbered bit lines BL1 and BL3, and the sub-block YDCU1B is connected to even numbered bit lines BL2 and BL4.

The sub-block YDCU1A includes plurality of discharge circuits BLD1 and BLD3, while the sub-block YDCU1B includes a plurality of discharge circuits BLD2 and BLD4. The discharge circuits BLD1 and BLD3 are responsive to the control signals Y1b and Y3b to connect the respective bit lines BL1 and BL3 to a reference potential VSS (e.g., ground) at one side of the memory cell block CBLK1. The bit line selection circuits YSEL2 and YSEL4 are responsive to the control signals Y2b and Y4b to connect the respective bit line BL2 and BL4 to the global bit line GBL1 at the other side of the memory cell block CBLK1.

As shown in FIG. 5, in the example of this embodiment, the bit line selection circuits YSEL<1-4> are implemented by PMOS transistors, while the discharge circuits BLD<1-4> are implemented by NMOS transistors. Also, the gates of the PMOS transistors of the bit line selection circuits YSEL<1-4> are connected to the respective gates of the NMOS transistors of the discharge circuits BLD<1-4>. Accordingly, the same control signal can be used to control each pair of the selection circuits YSEL and discharge circuits BLD connected to the same bit line BL. For example, when the control signal Y1b is LOW, the bit line BL1 is connected to the global bit line GBL1, and the discharge circuit BLD1 is OFF. In contrast, when the control signal Y1b is HIGH, the bit line BL1 is isolated from the global bit line GBL1, and the bit line BL1 is discharged to VSS by the discharge circuit BLD1. It should be noted, however, that the invention is not limited to these particular examples, and that other configurations of the possible.

According to the present embodiment, since the same control signal can be used to control each pair of the selection circuits YSEL and discharge circuits BLD connected to the same bit line BL, the bit line selection and discharge control scheme of the memory device is simplified.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A layout method of a semiconductor memory device, comprising:

locating a plurality of first bit line selection circuits at a first side of a variable resistive memory cell block, and locating a plurality of second bit line selection circuits at a second side of the variable resistive memory cell block opposite the first side;

connecting the first bit line selection circuits with respective odd-numbered local bit lines of the variable resistive memory cell block, and connecting the second bit line selection circuits with respective even-numbered local bit lines of the variable resistive memory cell block; and selectively connecting respective odd-numbered local bit lines to a global bit line using the first bit line selection circuits, and selectively connecting respective even-numbered local bit lines to the global bit line using the second bit line selection circuits.

2. The method of claim 1, wherein the variable resistive memory cell block is a phase change memory cell block.

3. The method of claim 2, wherein in the phase change memory cell block comprises a plurality of memory cells, each including a phase change material including germanium (Ge), antimony (Sb), and tellurium (Te).

4. The method of claim 1, wherein each of the first and second bit line selection circuits includes an MOS transistor connected between a respective local bit line and the global bit line.

5. A layout method of a semiconductor memory device, comprising:

locating a first bit line selection circuit at a first side of a variable resistive memory cell block, and locating a second bit line selection circuit at a second side of the variable resistive memory cell block opposite the first side; and locating a first discharge circuit at the first side of the variable resistive memory cell block, and locating a second discharge circuit at the second side of the variable resistive memory cell block opposite the first side, wherein the first bit line selection circuit selectively connects one of the local bit lines to a global bit line, and the second bit line selection circuit selectively connects another of the local bit lines to the global bit line, and wherein the first discharge circuit selectively discharges said one of the local bit lines, and the second discharge circuit selectively discharges said other of the local bit lines.

6. The method of claim 5, wherein the variable resistive memory cell block is a phase change memory cell block.

7. The method of claim 6, wherein in the phase change memory cell block comprises a plurality of memory cells, each including a phase change material including germanium (Ge), antimony (Sb), and tellurium (Te).

8. The method of claim 5, wherein each of the first and second bit line selection circuits includes an MOS transistor connected between a respective local bit line and the global bit line.

9. The method of claim 5, wherein each of the first and second bit line selection circuits includes an MOS transistor which is connected between a respective local bit line and the global bit line, and wherein each of the first and second discharge circuits includes an MOS transistor which is connected between a respective local bit line and a reference potential.

10. The method of claim 9, wherein the MOS transistors of the first and second bit line selection circuits are NMOS transistors which are gated to receive a first control signal, and wherein the MOS transistors of the first and second discharge circuits are NMOS transistors which are gated to receive a second control signal, wherein the first control signal is inverted relative to the second control signal.

11. The method of claim 9, wherein the MOS transistors of the first and second bit line selection circuits are PMOS transistors which are gated to receive a first control signal, and wherein the MOS transistors of the first and second discharge circuits are NMOS transistors which are gate to receive the first control signal.

12. A layout method of a semiconductor memory device, comprising:

selectively connecting a first set of local bit lines to a global bit line adjacent a first side of a variable resistive memory cell block; and selectively connecting a second set of local bit lines, to the global bit line adjacent an opposite side of the variable resistive memory cell block.

13. The method of claim 12, wherein the variable resistive memory cell block is a phase change memory cell block.

14. The method of claim 13, wherein in the phase change memory cell block comprises a plurality of memory cells, each including a phase change material including germanium (Ge), antimony (Sb), and tellurium (Te).

* * * * *